(12) United States Patent
Kim et al.

(10) Patent No.: US 9,254,531 B2
(45) Date of Patent: Feb. 9, 2016

(54) PCB MOUNTING METHOD

(75) Inventors: Duk-Yong Kim, Gyeonggi-do (KR);
Yoon-Yong Kim, Gyeonggi-do (KR);
Hee-Sung Go, Gyeonggi-do (KR)

(73) Assignee: KMW Inc., Hwasong-Kyonggi-Do (KR)

( * ) Notice: Subject to any disclaimer, the term of this patent is extended or adjusted under 35 U.S.C. 154(b) by 829 days.

(21) Appl. No.: 12/356,931

(22) Filed: Jan. 21, 2009

(65) Prior Publication Data

US 2009/0184155 A1    Jul. 23, 2009

(30) Foreign Application Priority Data

Jan. 18, 2008    (KR) ........................ 10-2008-0005686

(51) Int. Cl.
| | | |
|---|---|---|
| B23K 1/00 | (2006.01) | |
| H05K 3/00 | (2006.01) | |
| H05K 3/34 | (2006.01) | |

(52) U.S. Cl.
CPC ............ *B23K 1/0016* (2013.01); *H05K 3/0061* (2013.01); *H05K 3/341* (2013.01); *B23K 2201/42* (2013.01); *H05K 3/3484* (2013.01); *H05K 2201/0999* (2013.01); *Y02P 70/613* (2015.11)

(58) Field of Classification Search
None
See application file for complete search history.

(56) References Cited

U.S. PATENT DOCUMENTS

| | | | | |
|---|---|---|---|---|
| 5,155,904 | A * | 10/1992 | Majd ............................... | 29/837 |
| 5,757,251 | A | 5/1998 | Hashinaga et al. | |
| 6,276,593 | B1 * | 8/2001 | Artaki et al. ............. | 228/180.21 |
| 2003/0086245 | A1 * | 5/2003 | Wakabayashi et al. ....... | 361/719 |
| 2008/0003883 | A1 * | 1/2008 | Ni et al. .................... | 439/620.15 |
| 2009/0024345 | A1 * | 1/2009 | Prautzsch ........................ | 702/99 |
| 2009/0134205 | A1 | 5/2009 | Kimbara | |

FOREIGN PATENT DOCUMENTS

| | | |
|---|---|---|
| JP | 56083051 A | 7/1981 |
| JP | 61025222 A | 2/1986 |
| JP | 03034497 | 2/1991 |
| JP | 04-046591 | 4/1992 |
| JP | 05013061 | 2/1993 |
| JP | 06-125173 A | 5/1994 |
| JP | 09-051183 A | 2/1997 |
| JP | 10189803 A | 7/1998 |
| JP | 2004-087594 | 3/2004 |
| JP | 2005311055 A | 11/2005 |
| JP | 2006-041240 A | 2/2006 |
| JP | 2007180457 A | 7/2007 |
| KR | 20-1999-0031225 U | 7/1999 |
| KR | 20-0394682 Y1 | 8/2005 |
| WO | WO 2006099936 A2 * | 9/2006 |
| WO | 2009/091219 A2 | 7/2009 |

* cited by examiner

*Primary Examiner* — Kevin P Kerns
*Assistant Examiner* — Steven Ha
(74) *Attorney, Agent, or Firm* — Mintz Levin Cohn Ferris Glovsky and Popeo, P.C.; Kongsik Kim

(57) ABSTRACT

Provided is a method for mounting a Printed Circuit Board (PCB). The method includes providing a solder cream on a predetermined region of a bottom surface of the PCB except for a region requiring insulation, mounting the PCB on a mounting region of a housing on which the PCB is to be mounted, and fixedly coupling the PCB to the housing by melting and hardening the solder cream provided on the bottom surface of the PCB.

6 Claims, 3 Drawing Sheets

PCB MOUNTING METHOD

BACKGROUND OF THE INVENTION

1. Field of the Invention

The present invention relates to a method for processing a Printed Circuit Board (PCB) on which various electrical or electronic parts are mounted, and more particularly, to a method for mounting a PCB on an inner surface of a housing of an electrical or electronic device.

2. Description of the Related Art

A Printed Circuit Board (PCB) is a thin board on which chips or other electrical or electronic parts are installed. The PCB is made of tempered fiberglass or plastic, and parts mounted on the PCB are electrically connected through a circuit pattern, which is printed on the PCB by using copper, tin, gold, etc. Various parts mounted on the PCB may include a Surface Mounting Device (SMD) and a lead part, and a land portion for mounting an SMD part thereon and a lead hole for inserting a lead of a lead part thereinto are formed in the PCB.

Some types of parts mounted on the PCB may generate much heat during operation. In this case, an efficient heat radiation scheme is required. For example, in a transmission system for mobile communication and broadcast communication, a high-power and high-output amplifier is used, a core part of which, i.e., a high-output power amplifying element (that is, a transistor) generates a significant amount of heat. The generated heat may cause performance degradation, malfunction, and parts damage.

A typical heat radiation scheme is adopting a plurality of heat-radiation fins on an outer portion of a device requiring heat radiation. With this heat-radiation fin structure only, however, there is a limitation in heat-radiation performance, and efficient heat radiation cannot be expected.

Conventionally, a puck or a pallet has been positioned on a heat-radiation plate to attach an amplifying element onto the puck or the pallet. However, since the amplifying element is not attached directly onto the heat-radiation plate, the efficiency of heat radiation is deteriorated.

SUMMARY OF THE INVENTION

Accordingly, the present invention provides a method for mounting a Printed Circuit Board (PCB) to make efficient heat radiation possible.

The present invention also provides a method for mounting a PCB to allow an amplifying element to be easily replaced with another.

The present invention also provides a method for mounting a PCB to enable the PCB to be soldered directly to an aluminum housing.

To achieve the foregoing objects, according to an aspect of the present invention, there is provided a method for mounting a Printed Circuit Board (PCB). The method includes providing a solder cream on a predetermined region of a bottom surface of the PCB except for a region requiring insulation, mounting the PCB on a mounting region of a housing on which the PCB is to be mounted, and fixedly coupling the PCB to the housing by melting and hardening the solder cream provided on the bottom surface of the PCB.

DETAILED DESCRIPTION OF PREFERRED EMBODIMENTS

Hereinafter, a preferred embodiment of the present invention will be described in detail with reference to the accompanying drawings. In the following description, the matters defined in the description such as a detailed construction and elements are provided to assist a comprehensive understanding of the present invention, and it is obvious to those of ordinary skill in the art that predetermined modifications or changes of the matters described herein can be made without departing from the scope of the invention.

Figure 1:
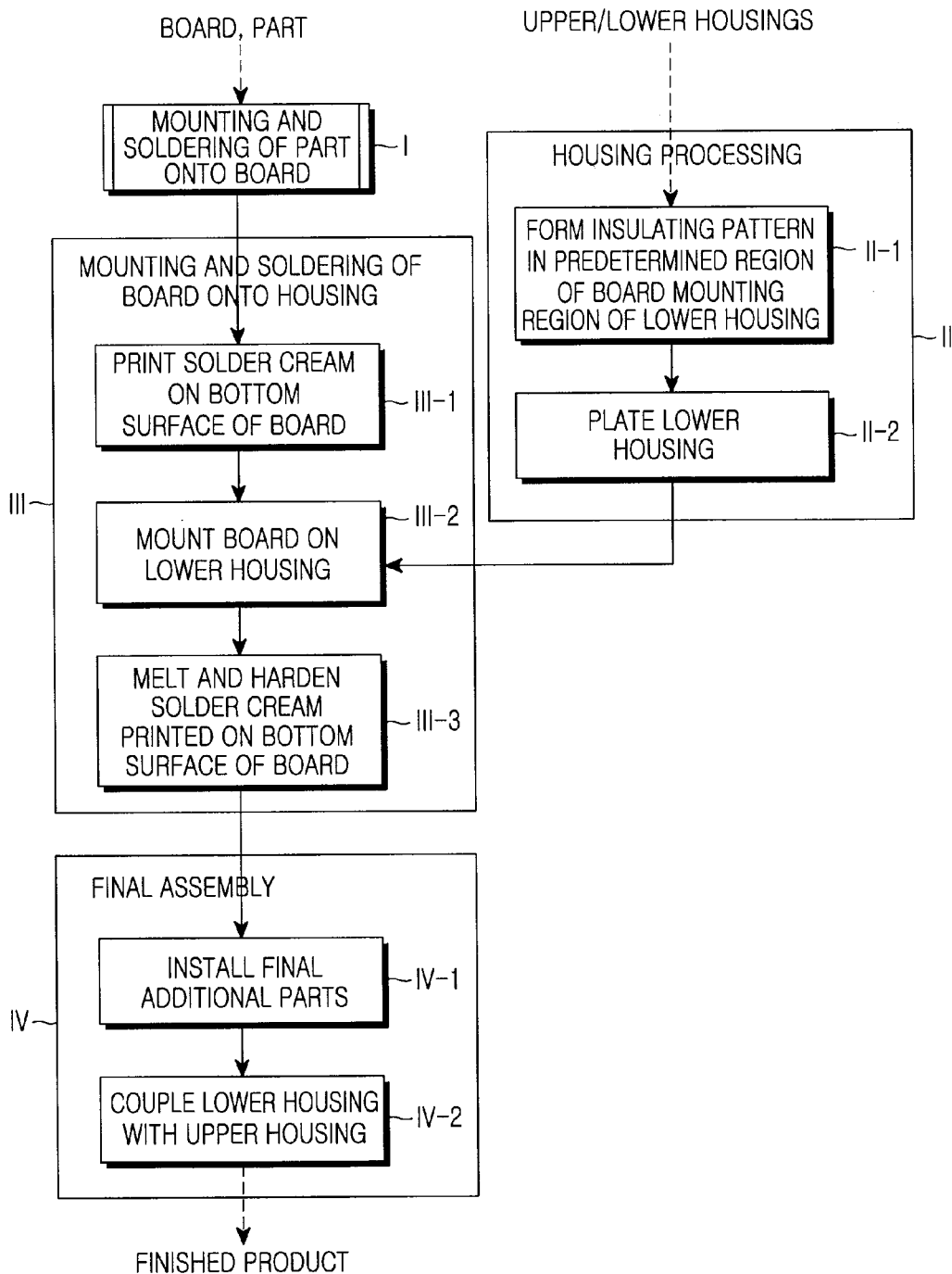
FIG. 1 is a schematic flowchart illustrating a product manufacturing process including a process of mounting a Printed Circuit Board (PCB) according to an embodiment of the present invention.

FIG. 1 is a flowchart illustrating a product manufacturing process including a process of mounting a Printed Circuit Board (PCB, which will hereinafter be referred to as a board) according to an embodiment of the present invention. A description will now be made of a product manufacturing process including a process III of mounting the board on a housing according to the present invention. The product manufacturing process roughly includes a process I of mounting and soldering a part on the board, a process II of manufacturing a housing generally separated into an upper housing and a lower housing and performing proper pre-processing on the upper and lower housings for board mounting according to features of the present invention, a process III of mounting and soldering the board to the lower housing according to features of the present invention, and a process IV of performing a final assembly operation including coupling of the upper housing to the lower housing on which the board has been mounted.

The process II may include a process II-1 of forming an insulating pattern in a groove form in a predetermined region (i.e., a region requiring insulation) of a board mounting region of the lower housing (or the housing) to prevent contact with the mounted board and a process II-2 of plating tin onto a predetermined soldering region of the lower housing to allow the board to be soldered directly to the housing.

The process III may include a process III-1 of printing a solder cream in a predetermined soldering region (e.g., most regions except for a region requiring insulation) of a bottom surface of the board for mounting on the lower housing, a process III-2 of mounting the board on the lower housing, and a process III-3 of melting and hardening the solder cream printed on the bottom surface of the board to fixedly couple the board to the housing.

The process IV may include a process IV-1 of installing final additional parts, such as input/output terminals of a product included in the housing, circuit connection between boards, etc., that can be installed after the board is coupled to the housing, and a process IV-2 of coupling the lower housing with the upper housing to manufacture a finished product.

As mentioned above, the process III is a process of coupling the board to the housing according to features of the present invention. Instead of using a conventional board mounting method in which the board is fixed to the housing by using a puck, pallet or a coupling means such as a screw, the present invention fixes the board to the housing in a direct soldering manner. Thus, the present invention allows heat being generated on the board by a part which generates much heat, such as a power amplifying element of a high-output amplifier, to be transferred directly to the housing for heat radiation, thereby providing high heat-radiation efficiency.

Hereinafter, each process shown in FIG. 1 will be described in more detail with reference to the accompanying drawings.

Figure 2:
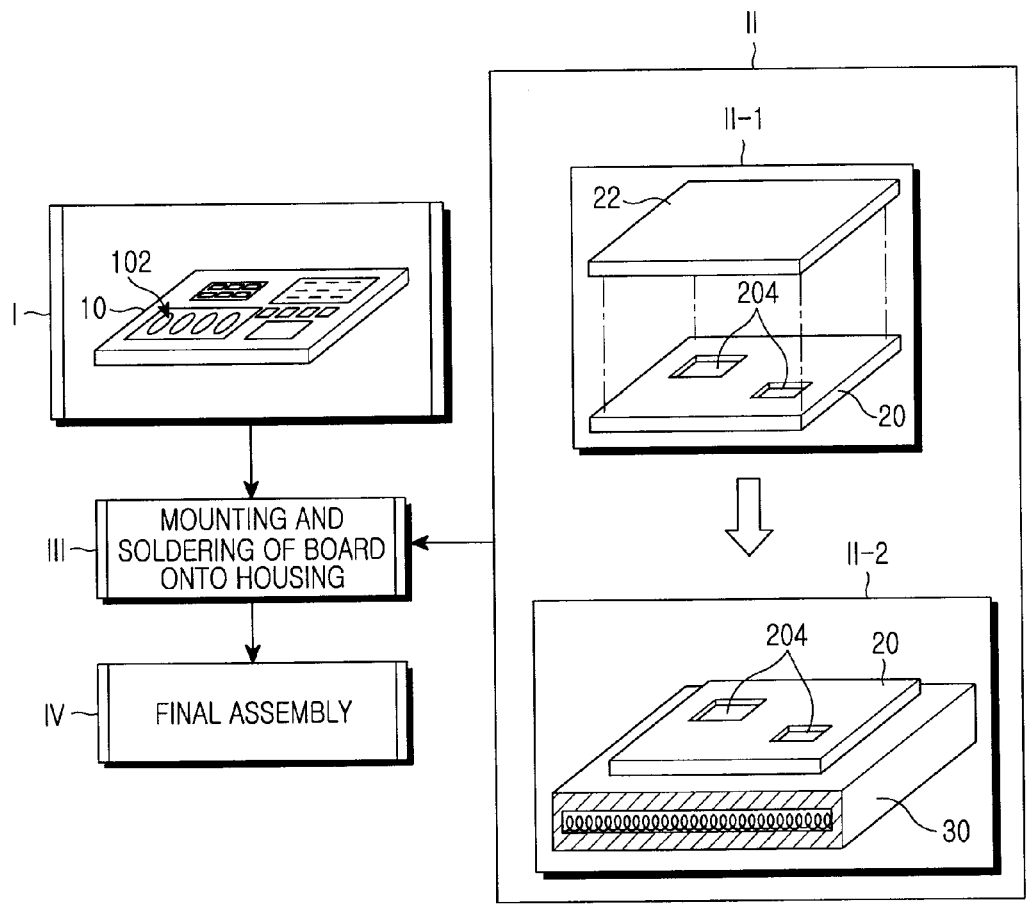
FIG. 2 is a view illustrating the states of a board and a housing in a process I and a process II shown in FIG. 1.

FIG. 2 is a view illustrating the states of the board and the housing in the process I and the process II shown in FIG. 1. Referring to FIG. 2, various parts may be mounted and soldered to a board 10 in the process I in the same manner as a conventional manner in which chips or other electrical or electronic parts are mounted and soldered onto a PCB. That is, a solder cream is printed in a land portion and a lead hole of the board 10 and then a Surface Mounting Device (SMD) part and a lead part are mounted on the board 10, after which mounting of the parts is completed by reflow soldering. Each of the parts may be mounted in an automatic insertion or manual insertion manner. For a mounting order or a soldering method for the SMD part and the lead part, various schemes are currently being suggested.

FIG. 2 schematically illustrates a simplified state in which various parts are mounted on the board 10 through the process I. In FIG. 2, a part which generates much heat, e.g., a power amplifying element (transistor) 102 of a high-output amplifier is particularly emphasized.

In the process II-1 of the process II, an insulating pattern 204 in a groove form is formed in a predetermined region of a region for mounting the board 10 on a lower housing 20 from between an upper housing 22 and the lower housing 20. The insulating pattern 204 prevents the lower housing 20 from contacting with a corresponding region of the board 10 when the board 10 is mounted on the lower housing 20, thereby allowing the corresponding region of the board 10 to be insulated from the lower housing 20. There may be a case where an exposed circuit pattern is implemented with a lead part, etc., on a bottom surface of the board 10 during circuit pattern designing of the board 10, or a part is mounted on the bottom surface of the board 10 in a double-surface mounting manner. This case can be handled by using the insulating pattern 204.

In the process II-2, plating with tin or the like is performed on a region for mounting the board 10 on the lower housing 20. The lower housing 20 is generally made of aluminum to which the board 10 cannot be soldered directly. For this reason, plating with tin is performed so that the board 10 can be soldered directly to the lower housing 20. The plating may be performed with not only tin but also any material that allows the board 10 to be soldered directly to aluminum. In addition, if the lower housing 20 is made of a material which allows the board 10 to be soldered directly to the board 10, the plating operation may not be performed.

In a soldering operation of re-melting the printed solder cream to mount the bottom surface of the board 10 on the lower housing 20, heat of relatively high temperature is generated. To reduce a possibility that parts mounted on the board 10 undergo changes in their characteristics or are damaged by the generated high-temperature heat, the soldering operation has to be performed within a short time.

Accordingly, such a plated lower housing 20 may be preheated to a predetermined proper temperature by using a heating device such as a hot plate 30. The present invention distinctively uses a manner in which the board 10 is fixed to the lower housing 20 through direct soldering. By pre-heating the lower housing 20 to a proper temperature, the soldering operation for the board 10 can be completed within a short time.

Figure 3:
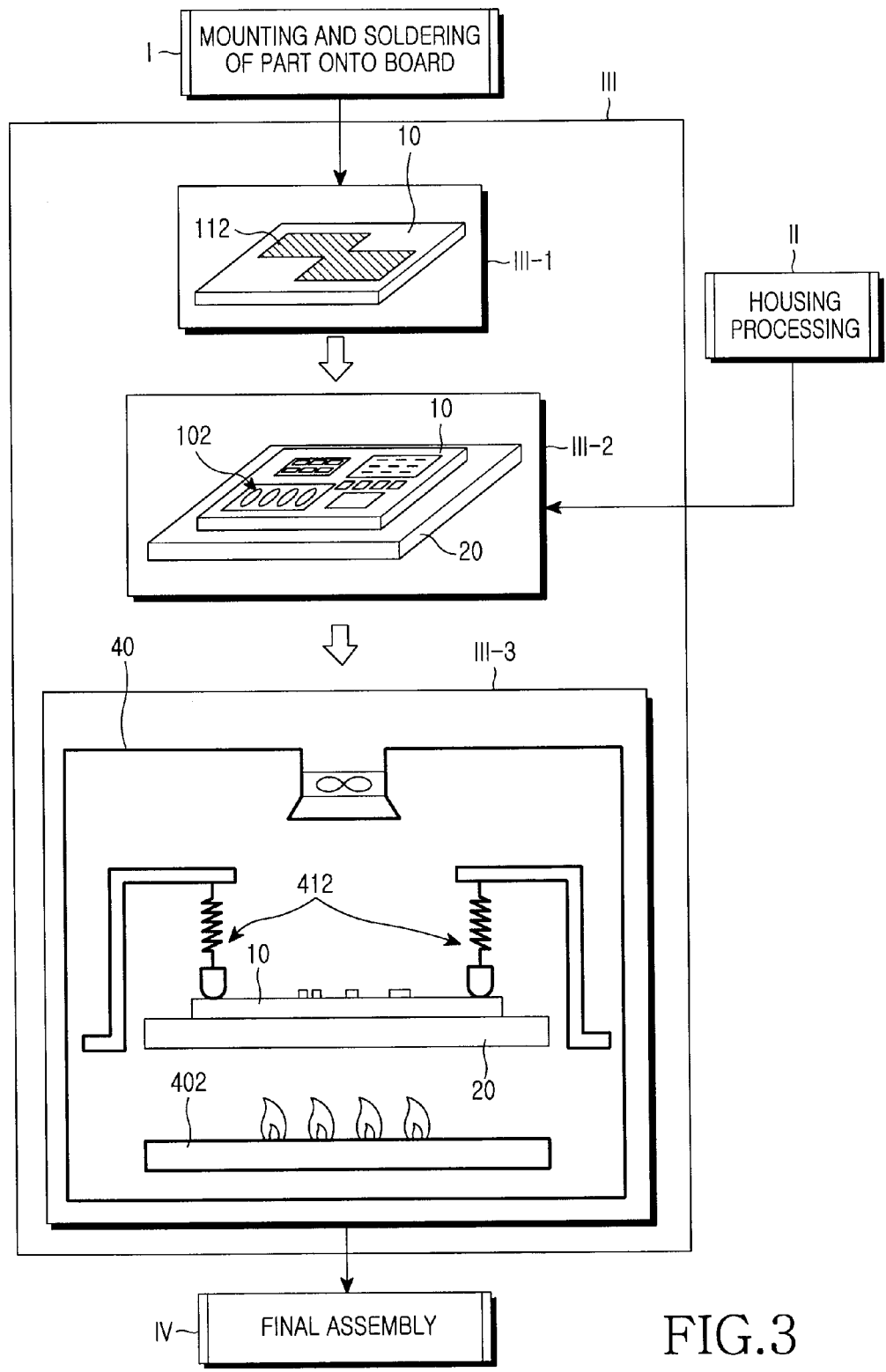
FIG. 3 is a view illustrating the states of a board and a housing in a process III shown in FIG. 1.

FIG. 3 is a view illustrating the states of the board and the housing in the process III shown in FIG. 1. Referring to FIG. 3, in a process III-1, a solder cream 112 for mounting on the lower housing 20 is printed on the bottom surface of the board 10. The solder cream 112 is printed on a region except for a region requiring insulation from the lower housing 20 (particularly, the region where the insulating pattern 204 is formed). Preferably, the solder cream 112 is printed on a region corresponding to the power amplifying element 102 on a top surface of the board 10, which is a core part requiring heat radiation.

For an amplifying element requiring heat radiation, a body of the element may also be soldered directly to the lower housing 20 via a through hole provided on the board 10 without passing through the board 10. In this case, more efficient heat radiation can be achieved when compared to the use of a puck, pallet. In other words, the through hole of a size corresponding to the size of the amplifying element is formed in the board 10 and the amplifying element is mounted in the board 10 in a way that it is inserted into the through hole. Thus, a bottom side of the amplifying element can be soldered directly to the lower housing 20.

The solder cream 112 printed on the bottom surface of the board 10 uses low-temperature lead having a lower melting point than a solder cream used to mount and solder a part to the board 10 in the process I. For example, the solder cream used for mounting a part on the board 10 may use high-temperature lead having a melting point of 217° C. and the solder cream 112 used for coupling the board 10 to the lower housing 20 may use low-temperature lead having a melting point of 137° C. The melting point may be adjusted with a ratio between lead (pb) and tin (Sn) which are components of a typical solder cream, or a solder cream having a proper melting point may be selected by using a lead-free material such as bismuth (Bi), tin (Sn), copper (Cu), silver (Ag), or the like. The solder cream having a low melting point is used for coupling the board 10 to the lower housing 20 to prevent a solder cream used for soldering a part to the board 10 from being melted or deformed by high-temperature heat applied to melt the solder cream for the coupling.

After the process III-1, in the process III-2, the board 10 having the solder cream 112 printed on the bottom surface thereof is mounted on the lower housing 20 plated in the process II.

In the process III-3, the solder cream 112 printed on the bottom surface of the board 10 is melted and hardened. The process III-3 may be carried out in a high-temperature furnace 40 having a structure similar to that of a high-temperature furnace used in typical reflow soldering. The high-temperature furnace 40 has a shape of a box hermetically sealed to some degree, and is structured such that it applies high-temperature heat wind generated by a heating unit 402 to the board-mounted lower housing 20 disposed therein. An appropriate region on the board 10, especially a periphery of a part which generates much heat, is pressed by using a jig 412 being in a proper form, such that the solder cream can be completely adhered to the board 10 and the lower housing 20. If the solder cream is not completely adhered to the board 10 and the lower housing 20, an air layer may be formed, which significantly degrades the heat radiation effect.

Since the board (and the amplifying element) is fixedly coupled to the housing in a direct soldering manner through the process III according to features of the present invention, heat generated on the board (and the high-output amplifying element) is transferred directly to the housing, thereby efficiently radiating the generated heat. The board bottom surface generally used as a ground terminal is electrically connected with the plated housing made of aluminum, whereby stable ground potential can be formed.

A method for mounting a PCB according to an embodiment of the present invention can be provided as described above. While the present invention has been shown and described with reference to a detailed embodiment thereof, various modifications may be implemented without departing from the scope of the invention. For example, in the foregoing description, the solder cream is printed to couple the board to the housing. The term 'printing' means a method in which a solder cream is formed to a predetermined thickness according to a pattern by using a screen mask forming the typically proper pattern. The present invention may also use various general methods for soldering a part onto a board, such as applying a solder cream without using a screen mask.

While high-temperature lead is used to solder a part onto a board and low-temperature lead is used to solder the board to a housing in the foregoing description, a part prone to a trouble (e.g., a power amplifying element, which is a core part generating heat in a high-output amplifier) may be separately soldered to the housing by using low-temperature lead. By doing so, the part having a trouble can be easily removed and replaced with a new one.

Additionally, the housing is tin-plated in the foregoing description, but other types of plating which provides typical solder-coupling may also be performed on the housing.

Besides the above-described examples, various modifications and changes can be made in the present invention. Accordingly, the scope of the present invention is not to be limited by the above embodiment, but should be defined by the claims and the equivalents thereof.

The method for mounting a PCB according to the present invention makes efficient heat radiation possible and solves problems such as parts damage.

What is claimed is:

1. A method for mounting a Printed Circuit Board (PCB), the method comprising:
    applying a solder cream on a predetermined region of a bottom surface of the PCB except for a region requiring insulation;
    directly mounting the PCB on a mounting region of a lower region of a housing on which the PCB is to be mounted;
    melting and hardening the solder cream provided on the bottom surface of the PCB to fixedly couple the PCB to the housing;
    installing additional parts in the housing, at least one of the additional parts being electrically connected to the PCB; and
    attaching an upper portion of the housing to the lower region of the housing;
    wherein the housing forms an exterior of an electrical and electronic product, wherein the PCB is directly soldered to the lower region of the housing without using a puck or pallet, the solder cream has a lower melting point compared with that which is used in soldering parts onto the PCB, and the PCB is soldered at a lower temperature compared with when the parts of the PCB are soldered; and
    a plurality of surface mounting device parts and lead parts are mounted on the PCB before the PCB is attached to the housing.

2. The method of claim 1, wherein plating is performed on at least a portion of the mounting region of the housing on which the PCB is to be mounted.

3. The method of claim 1, wherein an insulating pattern in a groove form is previously formed in the mounting region of the housing on which the PCB is to be mounted, the mounting region corresponding to the region requiring insulation.

4. The method of any one of claims 1 through 3, wherein the PCB is pressed by using a jig to allow the solder cream to be completely adhered to the PCB and the housing when the solder cream provided on the bottom surface of the PCB is melted and hardened.

5. The method of any one of claims 1 through 3, wherein at least one of the additional parts, which generates high-temperature heat, among parts to be mounted on the PCB is mounted in a manner in which the part is inserted into a predetermined through hole of the PCB, such that a bottom side of the part is soldered directly to the housing when the PCB is soldered to the housing.

6. The method of claim 2, wherein the plating performed on the housing is tin-plating.

* * * * *